United States Patent
Chen et al.

[19]

[11] Patent Number: 5,977,830
[45] Date of Patent: Nov. 2, 1999

[54] LOW NOISE TRANSISTOR MODULE AND AMPLIFIER

[75] Inventors: Young-Kai Chen, Berkeley Heights; George E. Georgiou, Gillette, both of N.J.

[73] Assignee: Lucent Technologies Inc., Murray Hill, N.J.

[21] Appl. No.: 08/974,816

[22] Filed: Nov. 20, 1997

Related U.S. Application Data

[60] Provisional application No. 60/031,548, Dec. 3, 1996.
[51] Int. Cl.$^6$ .............................. H03F 3/16; H03F 3/08; H01L 27/10
[52] U.S. Cl. ......................... 330/277; 330/308; 257/207
[58] Field of Search ...................... 330/277, 308; 257/202, 207, 401, 204, 208

[56] References Cited

U.S. PATENT DOCUMENTS 4,264,874  4/1981  Young ....................................... 330/277
5,693,966  12/1997  Anazawa et al. ....................... 257/207
5,714,784  2/1998  Ker et al. ............................. 257/401 X

OTHER PUBLICATIONS

I. Yoshida et al., Highly Efficient UHF–Band Si Power MOSFETs for RF Power Amplifiers, Electronics and Communications in Japan, Part 2, vol. 77, No. 4, pp. 10–19 (1994).

Primary Examiner—Robert Pascal
Assistant Examiner—Patricia T. Nguyen
Attorney, Agent, or Firm—S. W. McLellan

[57] ABSTRACT

A low noise transistor IC or module comprises a plurality of conventional CMOS transistors which are laid out in parallel in such a way that the effective gate width of the combination of transistors is increased, yet the effective gate resistance and hence the noise figure (NF) of the circuit are reduced. A low noise amplifier incorporating such a module is also described.

8 Claims, 5 Drawing Sheets

LOW NOISE TRANSISTOR MODULE AND AMPLIFIER

CROSS-REFERENCE TO RELATED APPLICATION

This application claims priority from Provisional application Ser. No. 60/031,548 filed on Dec. 3, 1996.

FIELD OF THE INVENTION

This invention relates to low noise amplifiers (LNAs) for use in analog systems and, more particularly, to low noise transistor integrated circuits or modules (LNTMs) for use in such LNAs.

BACKGROUND OF THE INVENTION

Complementary metal-oxide semiconductor (CMOS) processing is commonly used in the fabrication of digital integrated circuits (ICs) which operate at bit rates typically on the order of 100 Mb/s. At these speeds there is less concern about the effect of parasitic capacitance and resistance, thus enabling the use of standard twin-tub CMOS transistor designs with polysilicon gates.

In many analog applications at significantly higher speeds (e.g., above the 900 MHz speed encountered in many wireless applications) reduction of parasitics is particularly important. The prior art has attempted to address this problem by altering the fundamental CMOS transistor design, for example, by substituting a metal (e.g., Mo) gate for the polysilicon gate and by using very wide gates (e.g., gate widths of 100 µm). I. Yoshida et al., *Electronics and Communications in Japan*, Part 2, No. 77, No. 4, pp. 10–19 (1994), have taken this approach in their design of RF power amplifiers. However, significantly changing a standard CMOS process can be a very expensive proposition, entailing re-qualification of the CMOS manufacturing line with attendant high cost and likely lower yields. In addition, the device redesign for high power applications is often not optimum for low noise applications.

Thus, a need remains in the art for a LNA which can be implemented using conventional CMOS fabrication processes and transistor designs.

SUMMARY OF THE INVENTION

This need is addressed in accordance with one aspect of our invention, a low noise transistor IC or module (LNTM) comprising a plurality of conventional transistors which are laid out in parallel in such a way that the effective gate width of the combination of transistors is increased, yet the effective gate resistance and hence the noise figure (NF) of the circuit are decreased. Another embodiment of our invention is a LNA which includes such a LNTM.

BRIEF DESCRIPTION OF THE DRAWINGS

Our invention, together with its various features and advantages, can be readily understood from the following more detailed description taken in conjunction with the accompanying drawing, in which.

DETAILED DESCRIPTION OF THE INVENTION

Figure 1:
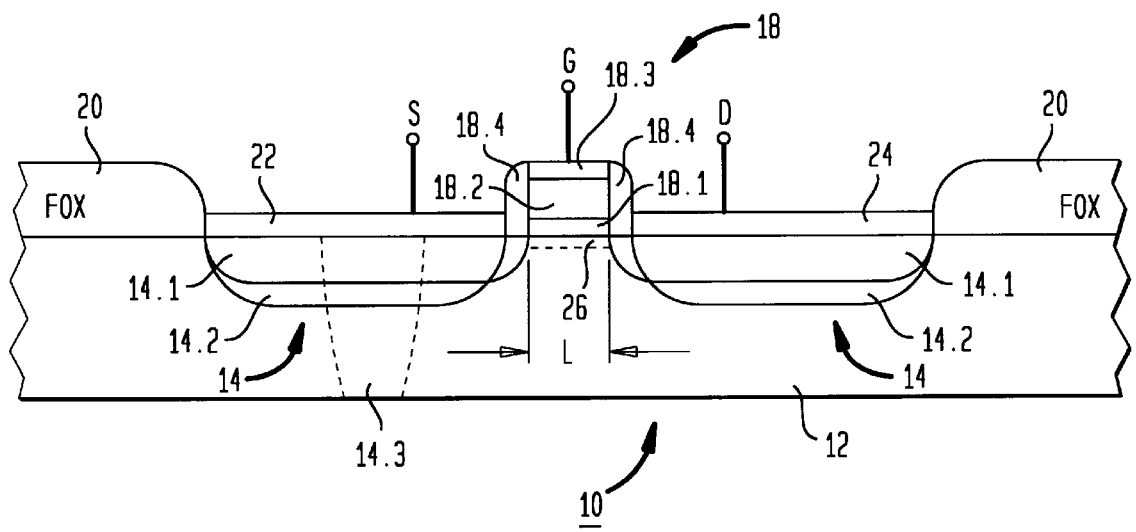
FIG. 1 is a schematic cross-sectional view of a conventional CMOS field effect transistor (FET) used to construct a variety of ICs, including LNAs and LNTMs; in the interests of clarity and simplicity this figure has not been drawn to scale.
Figure 2:
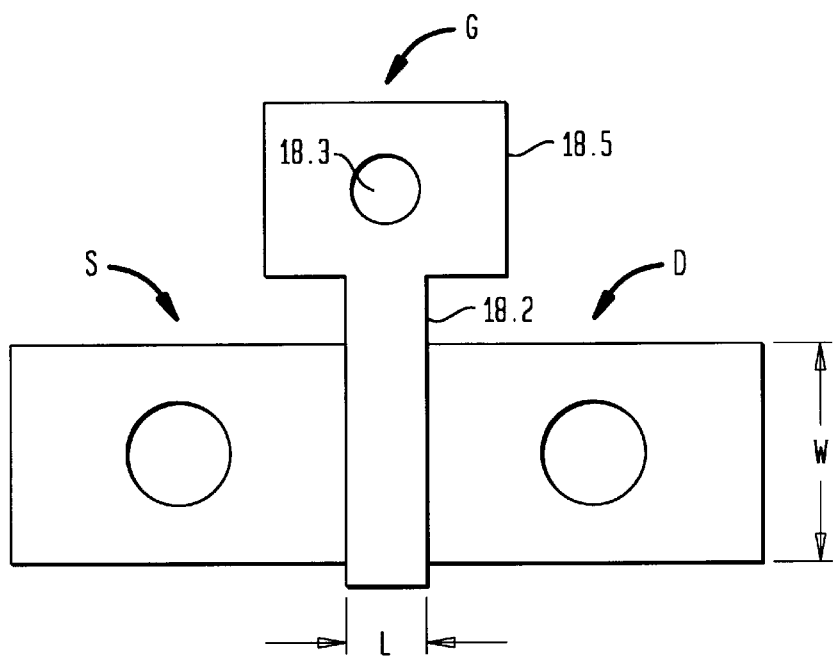
FIG. 2 is a plan view showing the layout of the source, drain and gate contacts of FIG. 1.

Before discussing our invention in detail, we briefly describe the design of a conventional CMOS FET 10 as shown in FIGS. 1 and 2. The transistor comprises a semiconductor body 12, illustratively a single crystal Si substrate, in which source and drain regions 14 and 16, respectively are formed, typically by ion implantation. The source and drain regions are located between a gate stack 18 and field oxide (FOX) layers 20. The gate stack typically includes a gate oxide (e.g., silicon dioxide) 18.1 formed on the substrate 12, a polysilicon region 18.2 formed on the gate oxide, and gate electrode (e.g., Al) 18.3 formed on the polysilicon region 18.2. As shown in FIG. 2, the gate electrode 18.3 is typically formed on a portion 18.5 of the polysilicon region 18.2 which extends over the FOX.

Dielectric spacers (e.g. silicon dioxide) 18.4 are formed on the sidewalls of the gate stack. In a lightly-doped drain (LDD) design the source and drain regions 14 each include a lightly doped, relatively shallow region 14.1 which extends laterally under the adjacent spacer 18.4 to the proximate gate stack sidewall, and a more heavily doped deeper region 14.2 which extends laterally only to the edge of adjacent spacer 18.4. Electrodes 22 and 23 make ohmic contact to the source and drain regions 14. The source electrode 22 is connected to the substrate by a deep ion-implanted region 14.3 (often called a tub-tie).

In a p-channel transistor, the substrate is an n-type semiconductor (e.g., Si) and the source and drain regions are ion-implanted with a p-type dopant (e.g. B). When a suitable gate voltage is applied, the surface underneath the gate oxide 18.1 is inverted, and a p-type channel 26 of length L is formed between the source and drain regions. The width W of the channel (or the gate) is measured perpendicular to the length L as shown in FIG. 2. When the source region is at a higher potential than the drain region, electrons flow from the source region, through the channel to the drain region.

Conversely, in an n-channel transistor, the substrate is a p-type semiconductor (e.g., Si), and the source and drain regions are ion-implanted with n-type dopants (e.g., P). Otherwise, the operation is analogous to that of the p-channel transistor described above.

In well-known twin-tub CMOS technology, these devices are formed side-by-side in opposite conductivity regions called tubs (not shown in FIG. 1).

The fabrication of CMOS transistors, particularly in Si-based technology, is a mature industry. Literally hundreds of processing steps (e.g., etching, polishing, masking, ion-implanting, depositing, measuring, testing, etc.) have to be qualified before a particular manufacturing line is ready to produce high perfornance, low cost ICs with high yields. Significantly altering the manufacturing process and/or the device design entails an expensive, time consuming requalification process which is to be avoided if at all possible. Thus, even if a particular IC seems to require a modified FET design, it is often preferable to use a fixed, conventional design of the FET in order to retain the underlying cost/yield benefits, and to satisfy the IC requirement in some other fashion. We have taken this approach in the design of our LNTM and our LNA.

More specifically, the noise figure (NF) of a FET (and hence of a LNA including such FETs) decreases as the gate resistance $R_G$ of the transistor decreases. Several layout options can be used to provide a transistor with channel width $W_{eff}$ and length L as required by a particular circuit design. A typical digital circuit layout approach would be to lay out a single wide transistor in which case the effective gate resistance would be given equation (1):

$$R_{G,D} = R_{SQ} W_{eff}/3L + R_c \qquad (1)$$

where $R_{SQ}$ is the sheet resistance of the gate material and $R_c$ is the metal-to-gate contact resistance. In this case, an increase in $W_{eff}$ produces an increase in gate resistance, which in turn increases the NF. Thus, without more, increasing $W_{eff}$ results in paying the penalty of a higher NF.

But, often there are circumstances when a circuit designer desires or needs a transistor of greater width in order to attain, for example, higher gain or higher current capacity, and yet is unwilling or unable to tolerate any significant NF penalty and or to change the underlying transistor fabrication process. Our invention provides this flexibility. In our approach, $R_{SQ}$ and $R_c$ are fixed properties related to the materials used in a particular CMOS fabrication process. A LNTM of width $W_{eff}$ is made by the parallel connection of N transistors each having a width $W_{eff}/N$ resulting in an effective gate resistance given by equation (2):

$$R_{G,P} = (R_{SQ} W_{eff}/3LN + R_c)(1/N) \qquad (2)$$

where the (1/N) factor results from the parallel connection of N gates each of width $W_{eff}/N$. In order to further reduce the contact resistance and hence the effective gate resistance, each gate may have M contacts as discussed below with reference to FIGS. 3 and 4. In this case, the effective gate resistance is given approximately by equation (3):

$$R_{G,P} = [(R_{SQ} W_{eff}/3LN) + (R_c/M)](1/N) + R_s \qquad (3)$$

where $R_s$, the resistance of the interconnect length required to connect the N transistors in parallel, can be reduced by using low resistance metal layers available in typical CMOS fabrication processes.

Note that $R_{G,P}$ is approximately $N^2$ smaller than $R_{G,D}$ and therefore produces a lower NF. However, the quantification of the NF reduction is not simple. In theory 1/N is the maximum factor by which NF can be reduced, but in practice the full 1/N reduction is not achieved because a lower noise limit is fixed by intrinsic noise sources (e.g., the transconductance of the transistors). Additional reduction in NF is achieved by reducing the source and drain interconnect resistance through the parallel connection of N transistors. Thus, relatively large $W_{eff}$ can be achieved pursuant to equations (2) and/or (3) with much lower parasitic resistances (e.g., gate resistance, contact resistance of the source and drain) and hence lower NF.

In summary, our approach is to use LNTMs to build transistors with larger $W_{eff}$ and at the 157 same time design N and M (i.e., the circuit layout complexity described below) to make the effective gate resistance according to equations (2) and/or (3) small for the desired NF.

Figure 3:
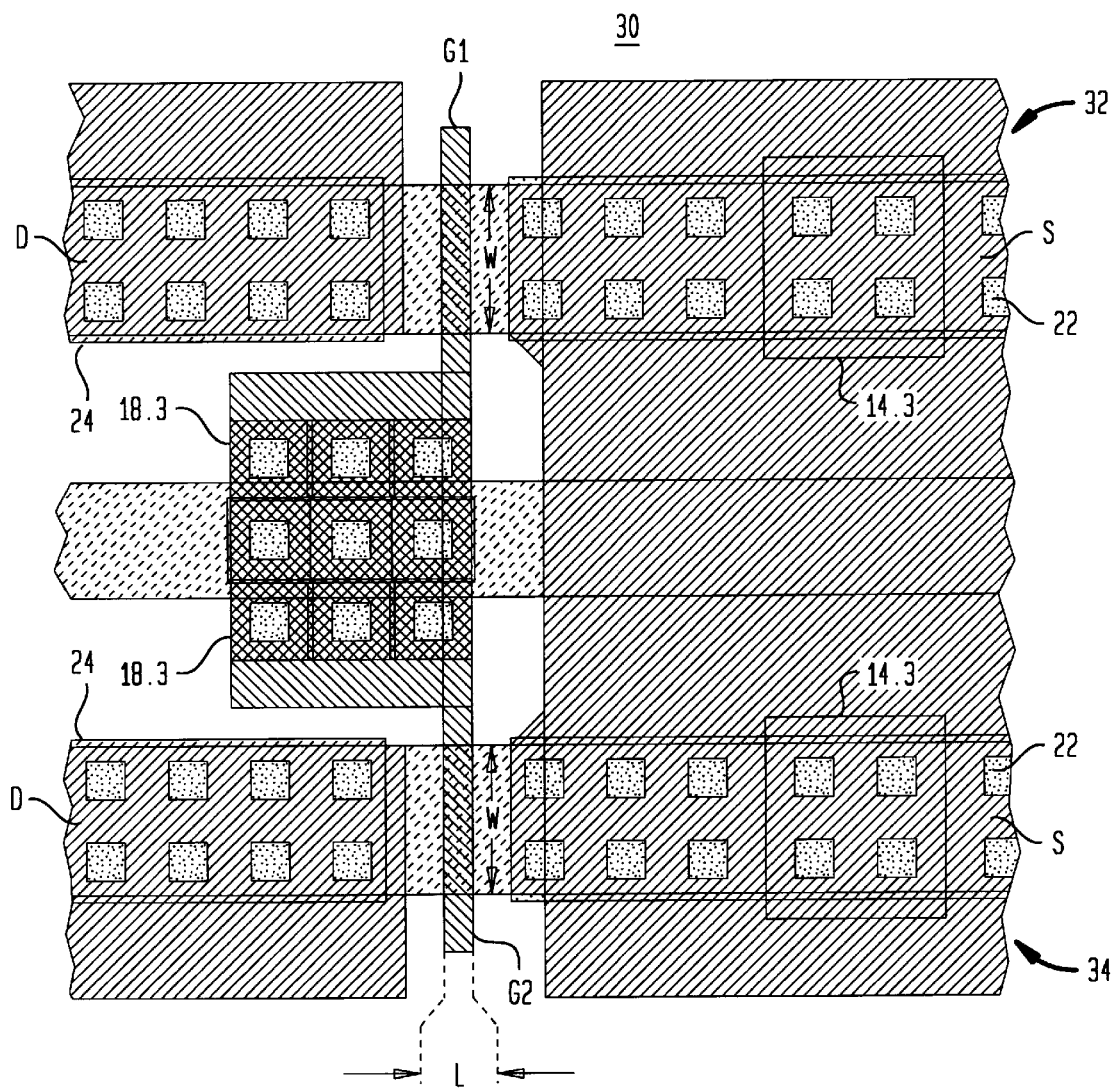
FIG. 3 is a plan view or layout of a single cell comprising two parallel FETs; small dark squares depict multiple contacts or vias to underlying semiconductor layers or bodies.

Increased $W_{eff}$ in accordance with one aspect of our invention is accomplished in a LNTM by forming a unique hierarchy of conventional FETs (e.g., as illustrated in FIG. 1) each having a fixed, standard design including a channel length and width L and W, respectively. The first level of the hierarchy, shown in FIG. 3, is a basic building block or cell 30 formed by a k=1,2 . . . FETs; when k=1, the cell includes just a single FET, but when k>1, the cell includes k FETs electrically connected in parallel with one another. The illustrative case of k=2 formed by a pair of FETs 32,34 electronically connected in parallel is shown in FIG. 3. (To facilitate comparison to the FET shown in FIG. 1, the FIG. 1 reference numerals identifying the source, drain and gate electrodes, as well as the tub-tie 14.3, have been repeated.) That is, the source electrodes 22 of all the FETS are connected to one another, the drain electrodes 24 are all connected to one another, and the gate electrodes 18.3 are likewise all connected to one another. These interconnections are not shown in FIG. 3, but can be readily seen in FIG. 4 which also shows the next two levels of the hierarchy.

Figure 4:
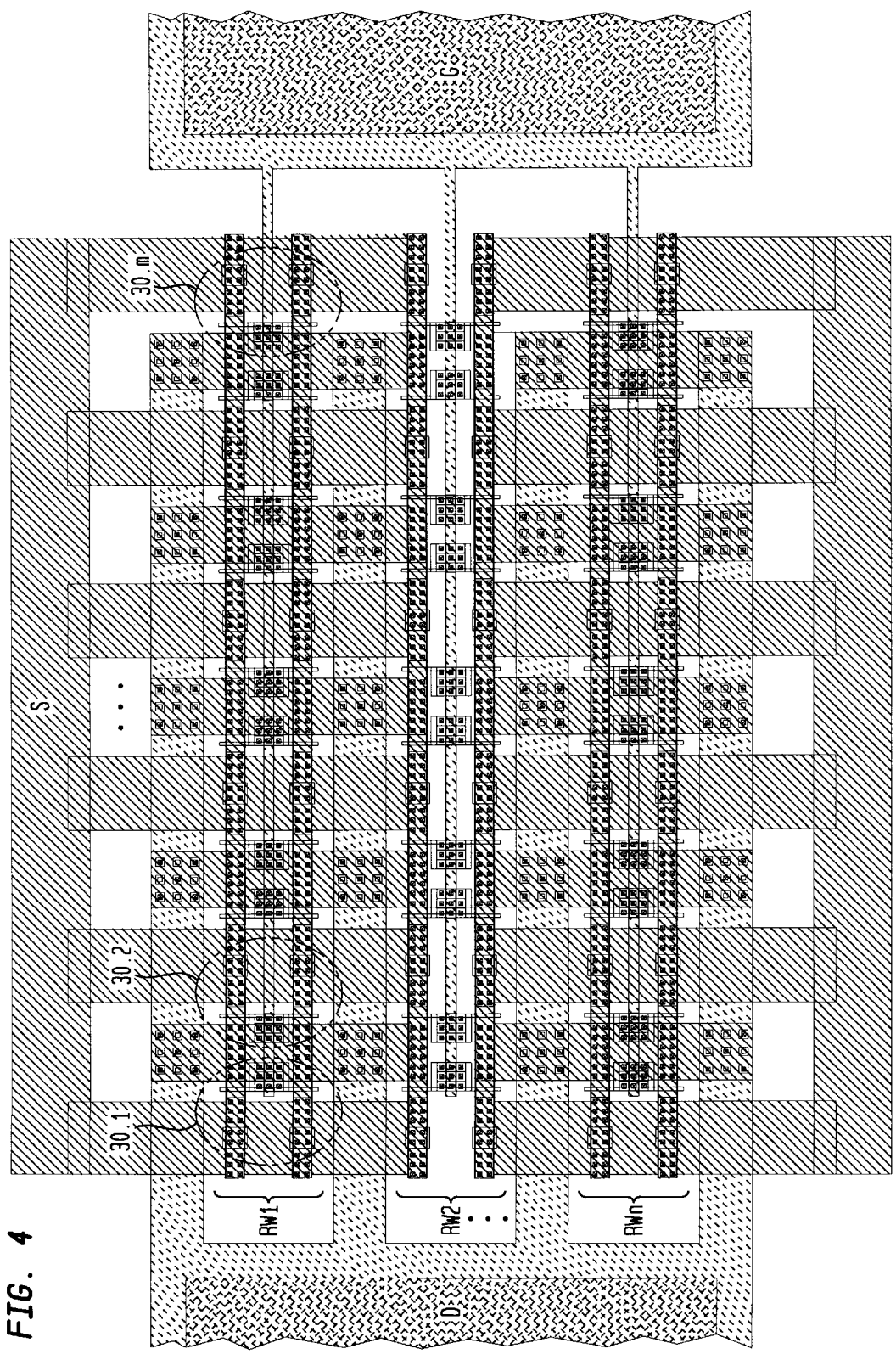
FIG. 4 is a plan view of a LNTM in accordance with one aspect of our invention; as above, the small dark squares represent multiple contacts or vias between the metal electrode and the underlying semiconductor.

The second level of the hierarchy comprises a row (e.g. RW1) of m cells 30.1, 30.2 . . . 30.m arranged topologically in tandem but electrically in parallel. For purposes of illustration only the case of m=10 cells is depicted in FIG. 4. The third level constitutes n rows RW1, RW2 . . . RWn of cells arranged topologically parallel to one another as well as electrically in parallel with one another. The case of n=3 is depicted by way of illustration only.

With this hierarchical arrangement the LNTM has an effective gate width $W_{eff}$ given by $$W_{eff} = kmnW \qquad (4)$$

where kmn=N. For example, if each standard FET has a gate width W=2.5 µm, then the LNTM with k=2, n=10 and m=3 would have an effective gate width of 150µm and an effective gate resistance about $N^2$=900 times lower than that of a single transistor with the same gate width. As discussed earlier, this reduction in effective gate resistance results in a reduction in NF. The designer has considerable latitude in the choice of m and n, taking into consideration limitations imposed by the physical layout (e.g., circuit area) and the total current deliverable to the power rail (e.g., to source electrodes). Thus, for example, we have built a LNTM with W=2.5 µm, k=2, m=10 and n=20 to provide $W_{eff}$=1000µm. Of course, gate widths other than 2.5 µm and other values of k, m and n are contemplated by the invention.

EXAMPLE I

This example describes a LNTM we built and operated to demonstrate the effectiveness of our invention to reduce the NF. The various parameters and operating conditions are provided by way of illustration only and, unless expressly indicated otherwise, are not intended to limit the scope of the invention.

Using twin-tub 3 V, 0.5 µm design rule CMOS technology and standard photolithography, we fabricated n-channel (NMOS) FET active devices of the type shown in FIG. 1 with W=2.5 μm and L=0.5 μm. The devices had 90 Å thick gate oxides 18.1, high resistivity, unsilicided, diffused polysilicon gates 18.2 and silicon source and drain regions 14. We used three levels of about 0.5 μm thick Al metalization with 0.8 μm thick interlevel, deposited silicon oxide, and no interlevel dielectric planarization or plugs. The basic cell shown in FIG. 3 comprised two such FETs electrically connected in parallel. A LNTM as shown in FIG. 4 was fabricated with 10 cells in each of 3 parallel rows (i.e., k=2, m=10 and n=3) to yield $W_{eff}$=150 μm.

Although p-channel (PMOS) FETs were also fabricated, they were used only for current source biasing. Therefore, in this Example I our measurements focus on the n-channel devices which were also used in our LNA design (FIG. 5) described in Example II.

Figure 6:
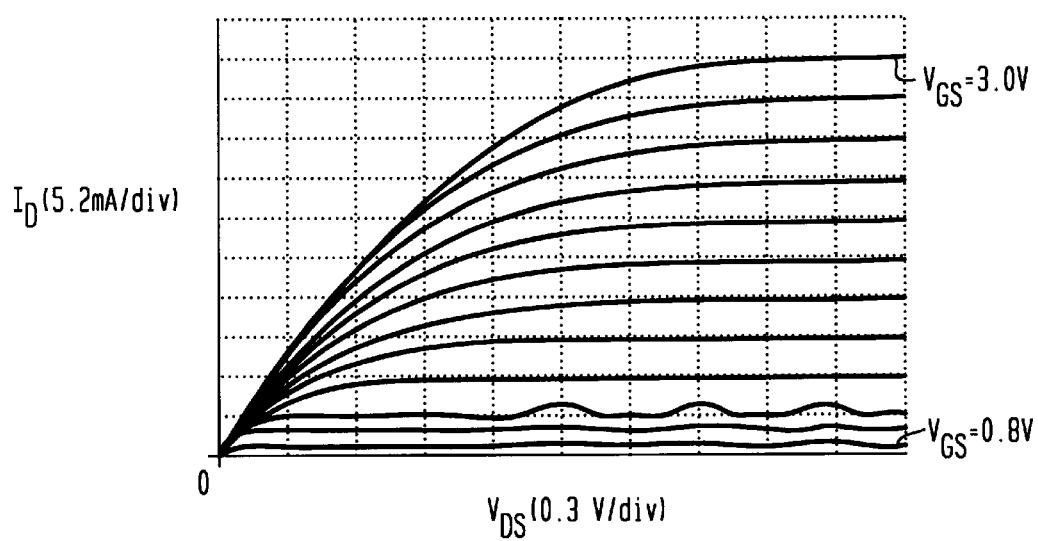
FIG. 6 is a plot of drain current ($I_D$) versus drain voltage ($V_{DS}$) of an n-channel FET for a series of gate voltages ($V_{GS}$) ranging from 0.8 V to 3.0 V in 0.2 V increments.

FIG. 6 shows a family of $I_D$ VS. $V_{DS}$ characteristics of the LNTM for a series of gate voltages $V_{GS}$ ranging from 0.8 V to 3.0 V in 0.2 V increments. The threshold voltage $V_T$ was 0.75 V.

The noise parameters (NF, gain) of the LNTM were obtained using a commercially available Cascade Noise Parameter Test System. Two different measurements were performed: (1) variable drain bias $V_{DS}$ and fixed gate voltage $V_{GS}$; the results are shown in FIG. 7; and (2) biasing the devices at 200 mV into the saturation region (i.e., $V_{DS}$=$V_{GS}$-$V_T$+200 mV) with variable drain current levels; the results are shown in FIG. 7.

Figure 7:
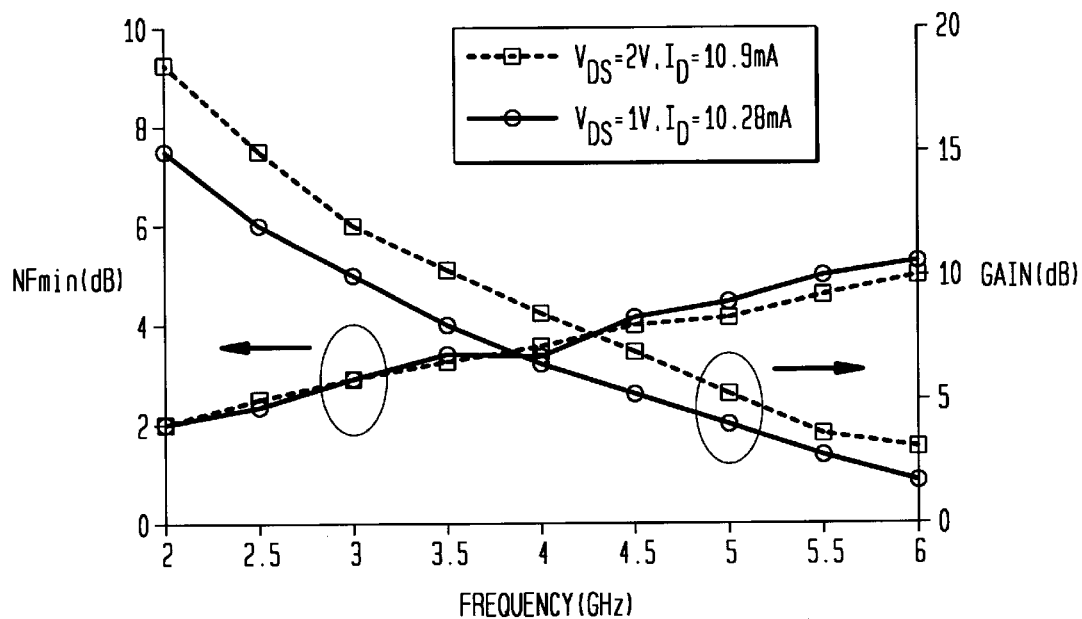
FIG. 7 is a plot of minimum NF and maximum available gain versus frequency for $V_{GS}$=1.45 V and two different values of $V_{DS}$ (2 V and 1 V)

The FIG. 7 data, taken with $V_{GS}$=1.45 V, indicates that when $V_{DS}$ is increased from 1 V to 2 V, $NF_{min}$ remains about the same, whereas the associated gain increases by 2–3dB. The increased gain results from the higher cut-off frequency brought on by the increased current level. The $NF_{min}$ of 2 dB with more than 15 dB of gain is very attractive for wireless applications.

Figure 8:
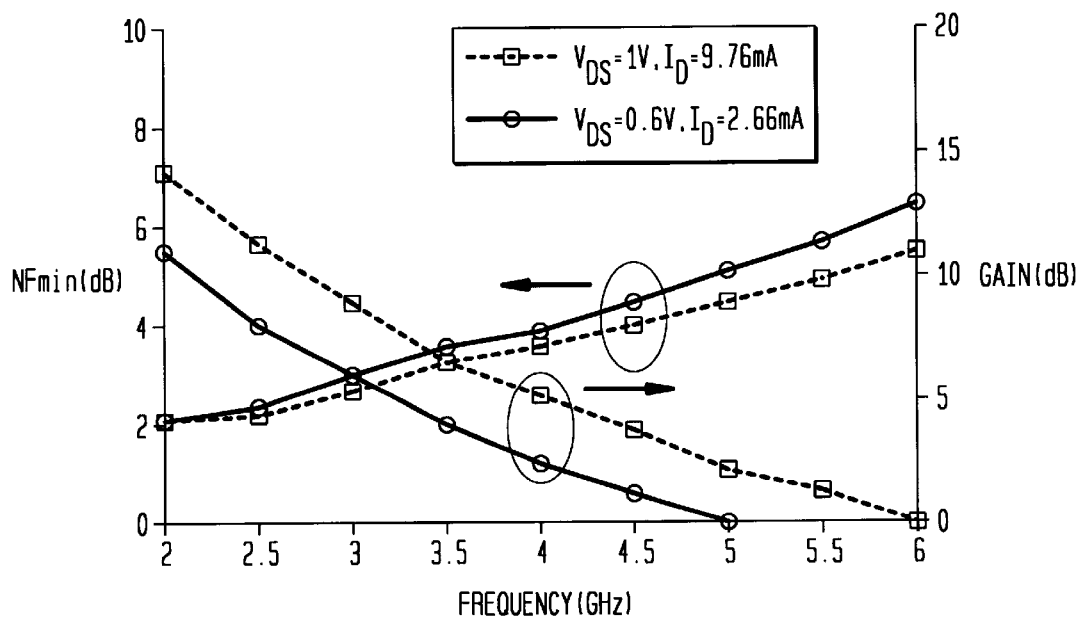
FIG. 8 is a plot of minimum NF and maximum available gain versus frequency for the case where each transistor is biased at about 200 mV into the saturation region for two different current levels $I_D$ (9.76 mA and 2.66 mA). The corresponding saturation voltages were $V_{DS}$–0.2 V, or 0.8 V and 0.4 V for the two cases shown.

The FIG. 8 data, taken with $I_D$=2.66 mA and 9.76 mA, indicates that $NF_{min}$ increases only slightly for the lower bias current at higher frequencies, whereas the associated gain is again 2–3dB higher at the lower current level.

EXAMPLE II

Figure 5:
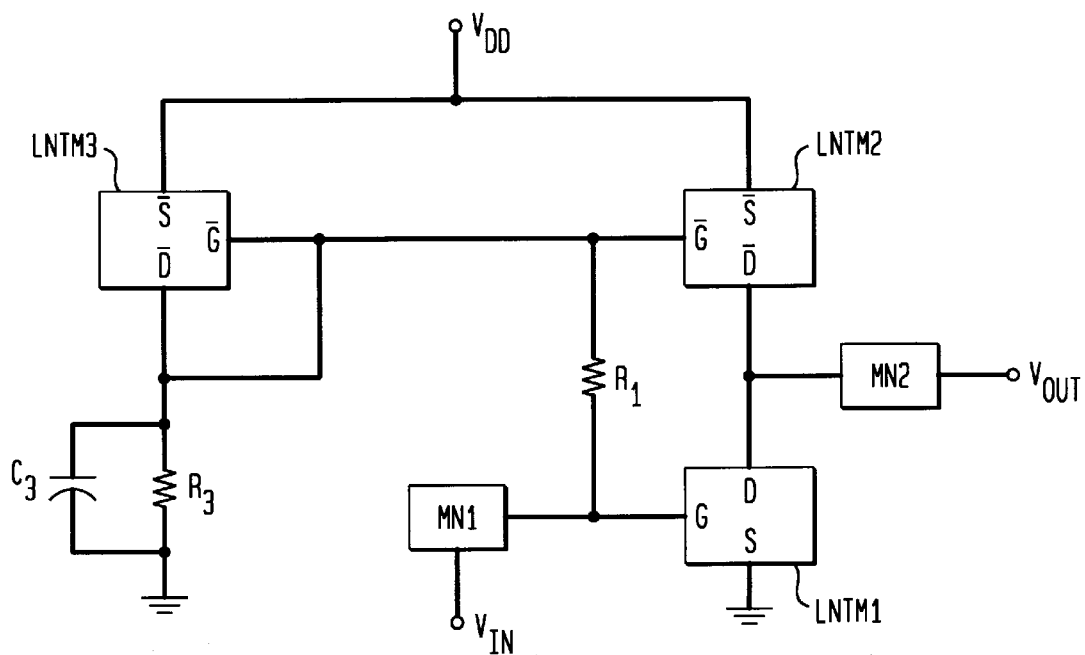
FIG. 5 is a circuit schematic of a LNA including LNTMs of the type shown in FIG. 4.

The LNTM described in Example I was incorporated into a single stage LNA with 10 dB of gain at 2 GHz. The LNA, shown in the simplified schematic of FIG. 5, receives an input signal $V_{IN}$ to be amplified through an first matching network MN1 and delivers the amplified signal $V_{OUT}$ through a second matching network MN2. The LNA includes LNTM1 for providing gain and LNTM2 and LNTM3 which act as a current source load for LNTM1. More specifically LNTM2 serves as the load for LNTM1, and LNTM3 sets the DC bias of LNTM2. To this end, LNTM2 and LNTM3 comprise transistors of the same conductivity type (e.g., PMOS), whereas LNTM3 comprises transistors of the opposite conductivity type (e.g., NMOS). This factor is indicated in FIG. 5 by use of the reference letters S, D and G to designate the sources, drains and gates, respectively, of LNTM2 and LNTM3 in contrast with S, D and S for the source, drain and gate, respectively, of LNTM1.

From an interconnection standpoint, the sources of LNTM2 and LNTM3 are coupled to $V_{DD}$, and their gates are coupled to one another and to MN1 (through $R_1$). The drain of LNTM3 is coupled to ground (or other reference potential) through the parallel combination of resistor $R_3$ and bypass capacitor $C_3$ (which may be an on-chip or off-chip capacitor). The drain of LNTM2 is coupled to the drain of LNTM1; both drains are coupled to MN2. Resistor $R_1$ couples the gates of LNTM2 and LNTM1 to one another. The gate of LNTM1 is coupled to MN1.

The matching networks are well known in the art and are designed to provide impedance matching: MN1 to the source of the input signal and MN2 to the load to which the output signal is delivered. The matching is done in a way to satisfy the gain and noise specifications of the LNA, which can also be controlled to some extent by the size and layout of the transistors of the LNTMs.

An LNA of the type described with reference to FIG. 5 was built and operated so as to deliver 10 dB of gain at 2 GHz with a NF of about 3. In the LNA LNTM1 had a $W_{eff}$=100 μm and L=0.5 μm, LNTM2 had $W_{eff}$=100 μm and L=0.6 μm, LNTM3 had $W_{eff}$=50 μm and L=0.8 μm, $R_1$=500 Ω, $R_3$=1 kΩ, $C_3$=1 pF, and $V_{DD}$=3 V. LNTM3 and $R_3$ are chosen to provide about 7 mA of drive current to LNTM2. Hence, the current in LNTM1 is also about 7 mA. The connection of the gates of LNTM2 and LNTM1 through $R_1$ is a simple method to turn on LNTM1 independent of the magnitude of the input signal.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the LNA of FIG. 5 preferably utilizes LNTMs to provide the load and biasing functions as well as the gain function, thereby maximizing the reduction in NF for this configuration. However, There may be applications where fewer than all three of these functions are delivered by LNTMs; e.g., in applications which can tolerate a somewhat higher NF, it may be acceptable to use an LNTM only for the gain function (i.e., in LNTM1). In addition, although a single stage LNA has been depicted, our invention may be utilized to reduce NF in a plurality of interconnected LNAs such as, for example, cascaded LNAs.

What is claimed is:

1. A low noise transistor integrated circuit module having an effective gate width $W_{eff}$ comprising a cell including k FETs each having a gate length L and a gate width W=$W_{eff}$/N, where k=1, 2 . . . said FETs being electrically connected in parallel with one another when k>1, and each of said FETs having a gate width of about 2.5 μm or less, a plurality m of said cells being topologically arranged in a row and being electrically connected in parallel with one another, and a plurality n of said rows being arranged topologically parallel to one another and being electrically connected in parallel with one another, so that said effective gate width of said module is increased by a factor of kmn=N compared to said gate width W, thereby to decrease the gate resistance and noise figure of said module compared to a single transistor having a gate width $W_{eff}$.

2. The invention of claim 1 wherein the gate resistance of said module is decreased by a factor of approximately $N^2$.

3. The invention of claim 1 wherein said FETs comprise conventional CMOS transistors.

4. A low noise amplifier comprising a transistor circuit for providing gain, and a current source coupled to said gain circuit, characterized in that said transistor circuit comprises a module according to claim 1.

5. A low noise amplifier comprising a transistor circuit for providing gain, and a current source coupled to said gain circuit, said current source comprising a first transistor circuit for providing a load to said gain circuit and a second transistor circuit for biasing said first circuit, characterized in that said first and second circuits each comprise a low noise transistor integrated circuit module having an effective gate width $W_{eff}$ each of said modules including a cell including k FETs each having a gate length L and a gate width $W=W_{eff}/N$, where k=1, 2 . . . said FETs being electrically connected in parallel with one another when k>1, a plurality m of said cells being topologically arranged in a row and being electrically connected in parallel with one another, and a plurality n of said rows being arranged topologically parallel to one another and being electrically connected in parallel with one another, so that said effective gate width of said module is increased by a factor of kmn=N compared to said gate width W, thereby to decrease the gate resistance and noise figure of said module compared to a single transistor having a gate width $W_{eff}$.

6. A method of reducing the noise figure of an amplifier comprising fabricating a low noise transistor module having an effective gate width $W_{eff}$ by the steps of forming a cell including k FETs each having a gate length L and a gate width $W=W_{eff}/N$, where k=1, 2 . . . said FETs are electrically connected in parallel with one another when k>1, and each of said FETs has a gate width of about 2.5 μm or less, laying out a plurality m of the cells so that topologically they are arranged in a row and electrically they are connected in parallel, laying out a plurality n of said rows so that they are topologically arranged parallel to one another and electrically they are connected in parallel with one another, so that said effective gate width of said module is increased by a factor kmn=N compared to the gate width W, thereby to decrease the gate resistance of the module and the noise figure of the amplifier compared to a single transistor having a gate width $W_{eff}$.

7. The invention of claim 6 wherein said gate resistance is decrease by a factor of approximately $N^2$.

8. The invention of claim 6 wherein said forming step includes fabricating conventional CMOS transistors.

* * * * *